United States Patent
Dadheech et al.

(10) Patent No.: US 9,382,620 B2
(45) Date of Patent: ***Jul. 5, 2016

(54) ELECTRICAL CONTACT ELEMENT FOR A FUEL CELL HAVING AN ULTRA-THIN CONDUCTIVE LAYER COATING

(75) Inventors: Gayatri Vyas Dadheech, Rochester Hills, MI (US); Mahmoud H. Abd Elhamid, Grosse Pointe Woods, MI (US); Youssef M. Mikhail, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 237 days.

This patent is subject to a terminal disclaimer.

(21) Appl. No.: 12/847,212

(22) Filed: Jul. 30, 2010

(65) Prior Publication Data

US 2010/0316936 A1    Dec. 16, 2010

Related U.S. Application Data

(63) Continuation of application No. 11/566,909, filed on Dec. 5, 2006, now Pat. No. 7,803,476, which is a continuation-in-part of application No. 10/704,015, filed on Nov. 7, 2003, now abandoned.

(51) Int. Cl.
| | | |
|---|---|---|
| *H01M 8/0204* | (2016.01) | |
| *C23C 16/455* | (2006.01) | |
| *C23C 14/18* | (2006.01) | |
| *C23C 16/18* | (2006.01) | |

(Continued)

(52) U.S. Cl.
CPC ......... *C23C 16/45527* (2013.01); *C23C 14/185* (2013.01); *C23C 16/18* (2013.01); *H01M 8/021* (2013.01); *H01M 8/0204* (2013.01); *H01M 8/0206* (2013.01); *H01M 8/0228* (2013.01); *H01M 8/0232* (2013.01); *H01M 8/0234* (2013.01); *H01M 8/0245* (2013.01); *H01M 2008/1095* (2013.01); *Y02E 60/50* (2013.01); *Y02P 70/56* (2015.11); *Y10T 428/24975* (2015.01); *Y10T 428/265* (2015.01); *Y10T 428/31678* (2015.04)

(58) Field of Classification Search
None
See application file for complete search history.

(56) References Cited

U.S. PATENT DOCUMENTS

| | | |
|---|---|---|
| 3,982,100 A | 9/1976 | Hervert |
| RE37,284 E | 7/2001 | Li et al. |

(Continued)

FOREIGN PATENT DOCUMENTS

DE    102004053582 A1    6/2005

OTHER PUBLICATIONS

"monolayer." Merriam-Webster Online Dictionary. 2010. Merriam-Webster Online, May 10, 2010 <http://www.merriam-webster.com/dictionary/monolayer>.

*Primary Examiner* — Alix Eggerding
(74) *Attorney, Agent, or Firm* — Fraser Clemens Martin & Miller LLC; James D. Miller

(57) ABSTRACT

An electrically conductive fluid distribution element for use in a fuel cell includes a conductive metal substrate and a layer of conductive non-metallic porous media. The conductive non-metallic porous media has an electrically conductive material deposited along a surface in one or more metallized regions and having an average thickness less than about 40 nm. The metallized regions improve electrical conductance at contact regions between the metal substrate and the fluid distribution media.

18 Claims, 8 Drawing Sheets

(51) Int. Cl.
  *H01M 8/02* (2016.01)
  *H01M 8/10* (2016.01)

(56) References Cited

U.S. PATENT DOCUMENTS

| | | | |
|---|---|---|---|
| 6,372,376 B1 | 4/2002 | Fronk | |
| 6,716,549 B2* | 4/2004 | Bai et al. | 429/480 |
| 6,720,104 B2 | 4/2004 | Zuber et al. | |
| 6,723,462 B2 | 4/2004 | Fan et al. | |
| 7,344,798 B2 | 3/2008 | Vyas et al. | |
| 7,803,476 B2* | 9/2010 | Dadheech | C23C 14/185 |
| | | | 429/483 |
| 2001/0021470 A1* | 9/2001 | May et al. | 429/44 |
| 2002/0127465 A1* | 9/2002 | Forderer et al. | 429/44 |
| 2003/0096151 A1 | 5/2003 | Blunk et al. | |
| 2004/0191605 A1 | 9/2004 | Kinkelaar et al. | |
| 2005/0100774 A1 | 5/2005 | Elhamid | |
| 2005/0260484 A1 | 11/2005 | Mikhail et al. | |
| 2006/0263668 A1 | 11/2006 | Mikhail et al. | |
| 2007/0087176 A1 | 4/2007 | Dadheech et al. | |
| 2008/0134493 A1 | 6/2008 | Vyas et al. | |

* cited by examiner

ELECTRICAL CONTACT ELEMENT FOR A FUEL CELL HAVING AN ULTRA-THIN CONDUCTIVE LAYER COATING

CROSS-REFERENCE TO RELATED APPLICATIONS

This application is a continuation of U.S. patent application Ser. No. 11/566,909 filed on Dec. 5, 2006, which was a continuation-in-part of U.S. patent application Ser. No. 10/704,015 filed on Nov. 7, 2003. The entire disclosures of the above applications are hereby incorporated herein by reference.

FIELD OF THE INVENTION

The present invention relates to fuel cells, and more particularly to electrically conductive fluid distribution elements and the manufacture thereof, for such fuel cells.

BACKGROUND OF THE INVENTION

Fuel cells have been proposed as a power source for electric vehicles and other applications. One known fuel cell is the PEM (i.e., Proton Exchange Membrane) fuel cell that includes a so-called MEA ("membrane-electrode-assembly") comprising a thin, solid polymer membrane-electrolyte having an anode on one face and a cathode on the opposite face. The anode and cathode typically comprise finely divided carbon particles, very finely divided catalytic particles supported on the internal and external surfaces of the carbon particles, and proton conductive material intermingled with the catalytic and carbon particles. The MEA is sandwiched between gas diffusion media layers and a pair of electrically conductive contact elements which serve as current collectors for the anode and cathode, which may contain appropriate channels and openings therein for distributing the fuel cell's gaseous reactants (i.e. $H_2$ and $O_2$/air) over the surfaces of the respective anode and cathode.

Bipolar PEM fuel cells comprise a plurality of the MEAs stacked together in electrical series while being separated one from the next by an impermeable, electrically conductive contact element known as a bipolar plate or septum. The bipolar plate has two working surfaces, one confronting the anode of one cell and the other confronting the cathode on the next adjacent cell in the stack, and electrically conducts current between the adjacent cells. Contact elements at the ends of the stack contact only the end cells and are referred to as end plates.

Electrical contact elements are often constructed from electrically conductive metal materials. In an $H_2$ and $O_2$/air PEM fuel cell environment, the bipolar plates and other contact elements (e.g., end plates) are in constant contact with highly acidic solutions (pH 3-5) and operate in a highly oxidizing environment, being polarized to a maximum of about +1 V (vs. the normal hydrogen electrode). On the cathode side the contact elements are exposed to pressurized air, and on the anode side exposed to super atmospheric hydrogen. Unfortunately, many metals are susceptible to corrosion in the hostile PEM fuel cell environment, and contact elements made therefrom either dissolve (e.g., in the case of aluminum), or form highly electrically resistive, passivating oxide films on their surface (e.g., in the case of titanium or stainless steel) that increases the internal resistance of the fuel cell and reduces its performance. Further, maintaining electrical conductivity through the gas diffusion media to the contact elements is of great importance in maintaining the flow of electrical current from each fuel cell. Thus, there is a need to provide electrically conductive elements that maintain electrical conductivity, resist the fuel cell hostile environment, and improve overall operational efficiency of a fuel cell.

SUMMARY OF THE INVENTION

The present invention provides an electrically conductive fluid distribution element for use in a fuel cell which comprises a conductive metal substrate and a layer of conductive non-metallic porous media having a surface facing the metal substrate. One or of more metallized regions are formed on the surface of the layer, each metallized region containing an electrically conductive material and having a average thickness equal to about the diameter of one atom of the material. The conductive metal substrate is arranged in contact with the metallized regions to provide an electrically conductive path between the layer and the conductive metal substrate.

In alternate preferred embodiments of the present invention, an assembly for use in a fuel cell comprises an electrically conductive metal substrate having a major surface, a layer of electrically conductive porous fluid distribution media having a first and a second surface, wherein the first surface is in electrical contact with the major surface and the second surface confronts a membrane electrode assembly, and one or more metallized regions on the first and the second surfaces of the layer, each metallized region containing an electrically conductive material and having an average thickness equal to about the diameter of one atom of the material. An electrical contact resistance across the metal substrate through the metallized regions to the layer is less than a comparative contact resistance across a similar metal substrate and a similar layer of fluid distribution media absent the metallized regions.

Other alternate preferred embodiments comprise an electrically conductive fluid distribution element for a fuel cell, the element comprising a layer of electrically conductive porous media comprising carbon and one or more ultra-thin metallized regions along a surface of the layer, where the one or more metallized regions comprise an electrically conductive material and have an average thickness equal to about the diameter of one atom of the material.

Other preferred embodiments of the present invention comprise a method for manufacturing an electrically conductive element for a fuel cell, comprising depositing an electrically conductive material on a surface of an electrically conductive porous media to form one or more metallized regions having an average thickness equal to about the diameter of one atom of the material. The surface having the metallized regions is positioned adjacent to a metallic electrically conductive substrate. The substrate is contacted with the surface having the metallized regions to form an electrically conductive path between the substrate and the porous media.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
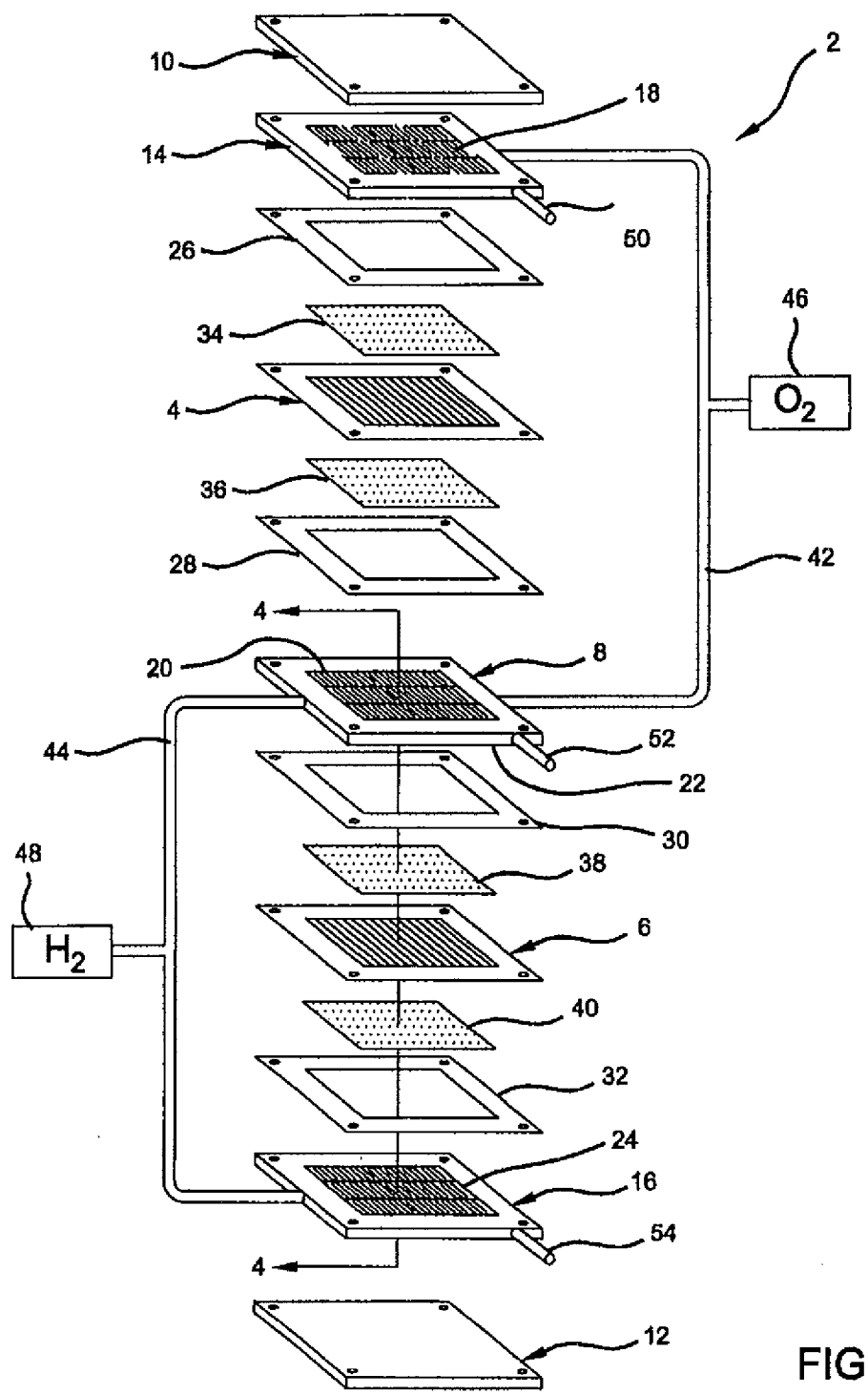
FIG. 1 is a schematic, exploded illustration of a PEM fuel cell stack (only two cells shown)

FIG. 1 depicts a two cell, bipolar fuel cell stack 2 having a pair of membrane-electrode-assemblies (MEAs) 4 and 6 separated from each other by an electrically conductive fluid distribution element 8, hereinafter bipolar plate 8. The MEAs 4 and 6 and bipolar plate 8, are stacked together between stainless steel clamping plates, or end plates 10 and 12, and end contact elements 14 and 16. The end contact elements 14 and 16, as well as both working faces of the bipolar plate 8, contain a plurality of grooves or channels 18, 20, 22, and 24, respectively, for distributing fuel and oxidant gases (i.e. $H_2$ and $O_2$) to the MEAs 4 and 6. Nonconductive gaskets 26, 28, 30, and 32 provide seals and electrical insulation between the several components of the fuel cell stack. Gas permeable conductive materials are typically carbon/graphite diffusion papers 34, 36, 38, and 40 that press up against the electrode faces of the MEAs 4 and 6. The end contact elements 14 and 16 press up against the carbon/graphite papers 34 and 40 respectively, while the bipolar plate 8 presses up against the carbon/graphite paper 36 on the anode face of MEA 4, and against carbon/graphite paper 38 on the cathode face of MEA 6. Oxygen is supplied to the cathode side of the fuel cell stack from storage tank 46 via appropriate supply plumbing 42, while hydrogen is supplied to the anode side of the fuel cell from storage tank 48, via appropriate supply plumbing 44. Alternatively, ambient air may be supplied using a compressor or blower to the cathode side as an oxygen source and hydrogen to the anode from a methanol or gasoline reformer, or the like. Exhaust plumbing (not shown) for both the $H_2$ and $O_2$ sides of the MEAs 4 and 6 will also be provided. Additional plumbing 50, 52, and 54 is provided for supplying liquid coolant to the bipolar plate 8 and end plates 14 and 16. Appropriate plumbing for exhausting coolant from the bipolar plate 8 and end plates 14 and 16 is also provided, but not shown.

Figure 2:
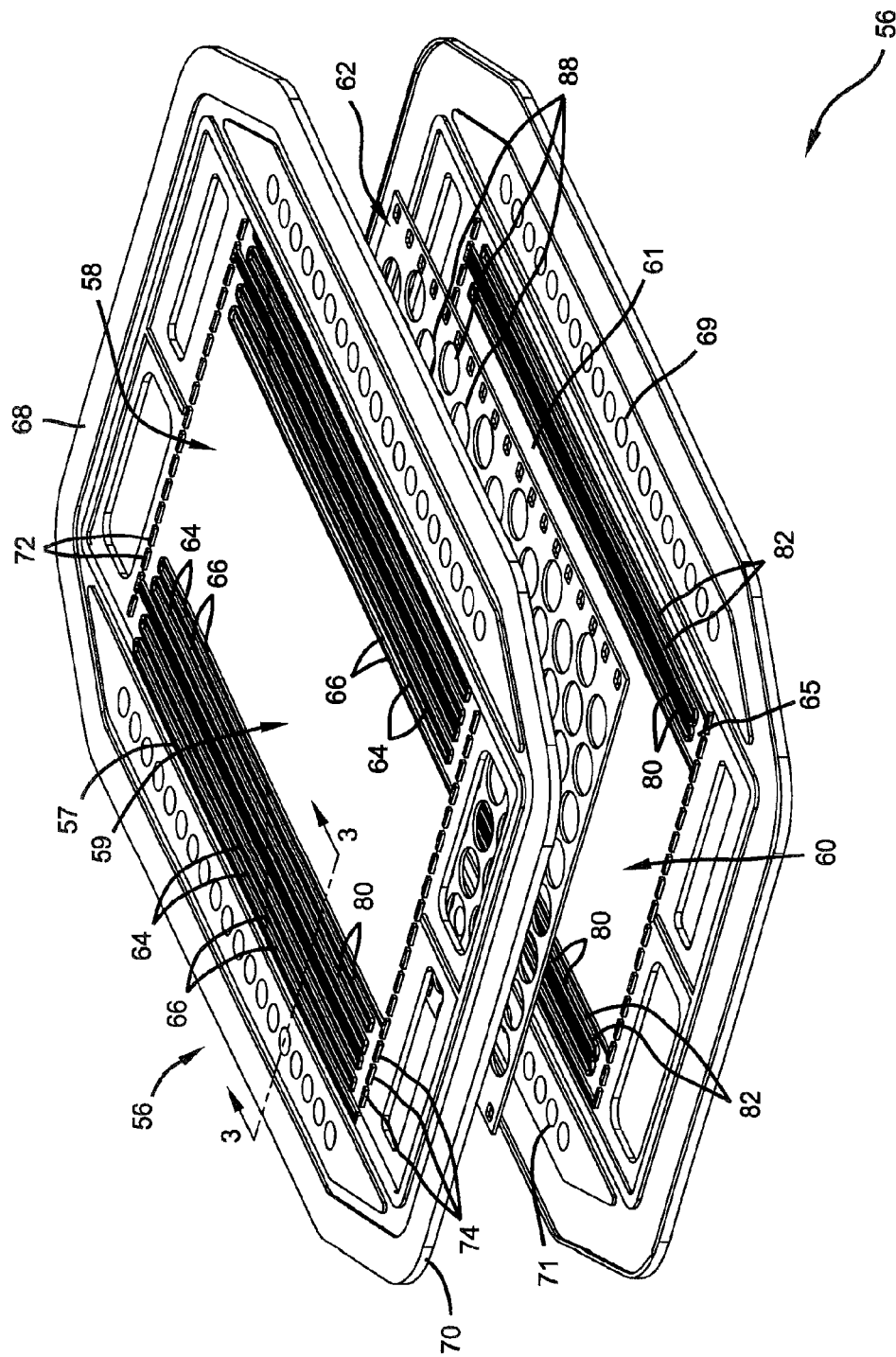
FIG. 2 is an exploded view of an exemplary electrically conductive fluid distribution element useful with PEM fuel cell stacks.

FIG. 2 is an exploded view of an exemplary bipolar plate 56 that may be used in accordance with a first embodiment of the present invention. The bipolar plate 56 comprises a first exterior metal sheet 58, a second exterior metal sheet 60, and an interior spacer metal sheet 62 interjacent the first metal sheet 58 and the second metal sheet 60. The exterior metal sheets 58 and 60 are made as thin as possible and may be formed by stamping, or any other conventional process for shaping sheet metal. The external sheet 58 has a first working face 59 on the outside thereof which confronts a membrane electrode assembly (not shown) and is formed so as to provide a flow field 57. The flow field 57 is defined by a plurality of lands 64 which define therebetween a plurality of grooves 66 which constitutes the "flow field" through which the fuel cell's reactant gases (i.e. $H_2$ or $O_2$) flow in a meandering path from one side 68 of the bipolar plate to the other side 70 thereof. When the fuel cell is fully assembled, the lands 64 press against the porous material, carbon/graphite papers 36 or 38 which, in turn, press against the MEAs 4 and 6. For simplicity, FIG. 2 depicts only two arrays of lands and grooves. In reality, the lands and grooves will cover the entire external faces of the metal sheets 58 and 60 that engage the carbon/graphite papers 36 and 38. The reactant gas is supplied to grooves 66 from a manifold 72 that lies along one side 68 of the fuel cell, and exits the grooves 66 via another manifold 74 that lies adjacent the opposite side 70 of the fuel cell.

Figure 3:
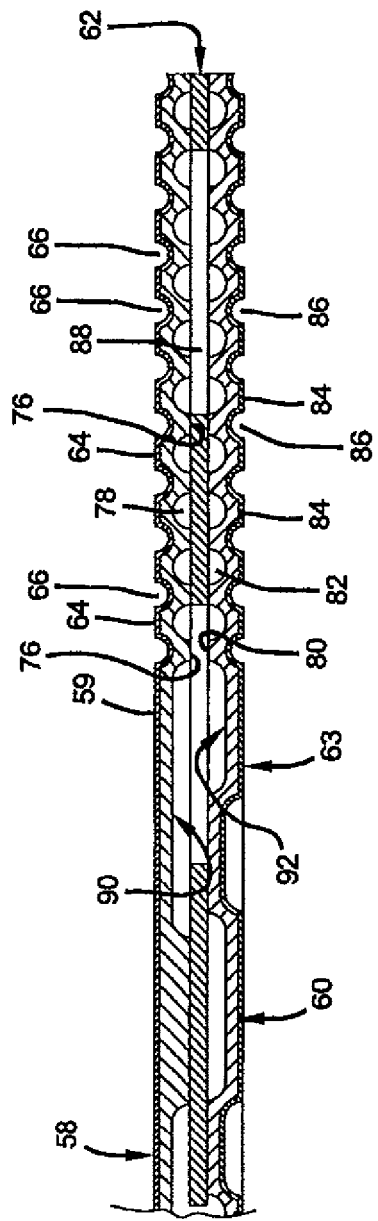
FIG. 3 is a partial cross-sectional view in the direction of 3-3 of FIG. 2.

As best shown in FIG. 3, the underside of the sheet 58 includes a plurality of ridges 76 which define therebetween a plurality of channels 78 through which coolant passes during the operation of the fuel cell. As shown in FIG. 3, the coolant channel 78 underlies each land 64 while a reactant gas groove 66 underlies each ridge 76. Alternatively, the sheet 58 could be flat and the flow field formed in a separate sheet of material. Metal sheet 60 is similar to sheet 58. The internal face 61 of sheet 60 is shown in FIG. 2. In this regard, there is depicted a plurality of ridges 80, defining therebetween, a plurality of channels 82 through which coolant flows from one side 69 of the bipolar plate to the other 71. Like sheet 58 and as best shown in FIG. 3, the external side of the sheet 60 has a working face 63. Sheet 60 is formed so as to provide a flow field 65. The flow field 65 is defined by a plurality of lands 84 thereon defining a plurality of grooves 86 which constitute the flow field 65 through which the reactant gases pass.

An interior metal spacer sheet 62 is positioned interjacent the exterior sheets 58 and 60 and includes a plurality of apertures 88 therein to permit coolant to flow between the channels 82 in sheet 60 and the channels 78 in the sheet 58 thereby breaking laminar boundary layers and affording turbulence which enhances heat exchange with the inside faces 90 and 92 of the exterior sheets 58 and 60, respectively. Thus, channels 78 and 82 form respective coolant flow fields at the interior volume defined by sheets 58 and 60. Alternate embodiments (not shown) comprise two stamped plates joined together by a joining process to form interior coolant from fields.

Figure 4:
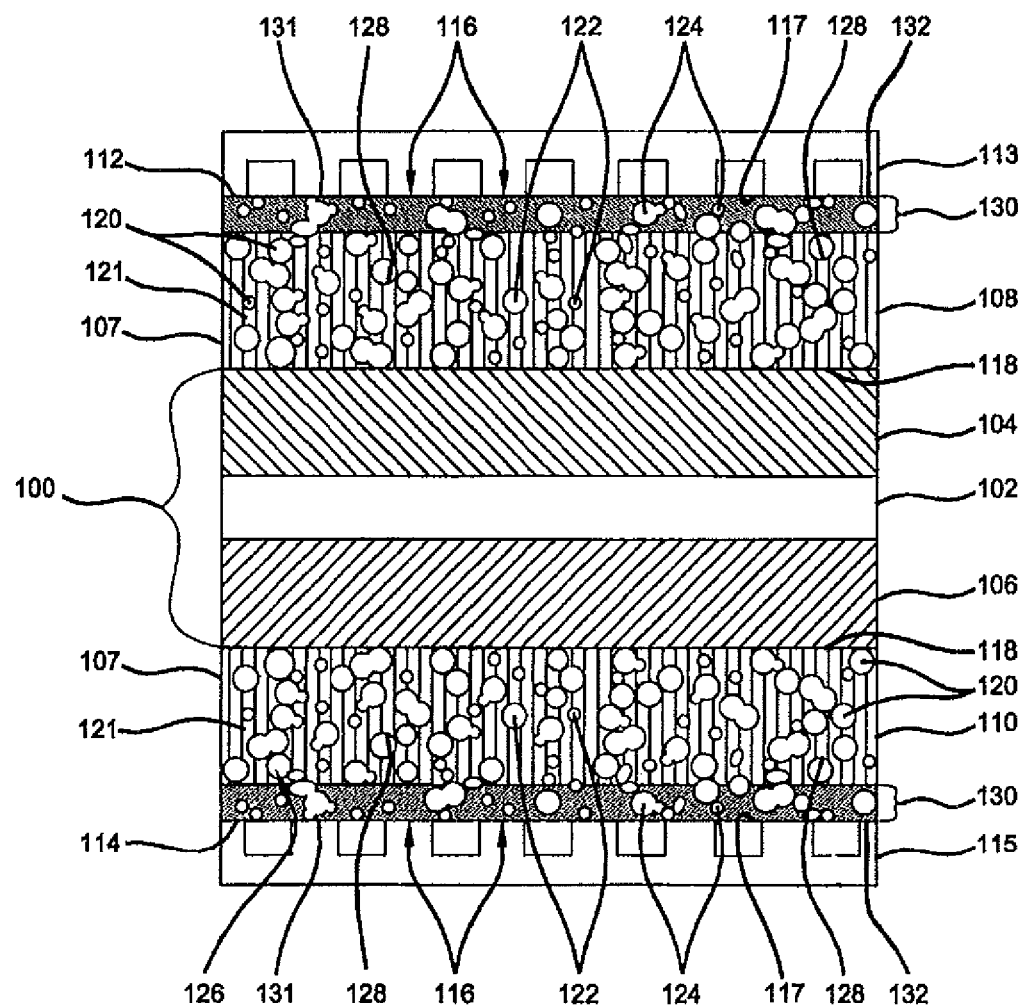
FIG. 4 is a not-to-scale side-sectional drawing taken in the direction of line 4-4 of FIG. 1 showing one preferred embodiment of the present invention where the metallized regions correspond to the entire surface of the layer of porous media.

In FIG. 4, a membrane-electrode-assembly 100 (MEA) comprises a membrane 102 sandwiched between an anode 104 and a cathode 106 which are bounded by an electrically-conductive material known as "diffusion media" or porous fluid distribution media 107. The porous media 107 is interposed between two current collectors separator plate substrates 113,115 and the MEA 100 and serves to (1) distribute gaseous reactant over the entire face of the MEA 100, between and under the lands 131 of the current collector 113,115, and (2) collect current from the MEA 100. A first fluid distribution media layer 108 is adjacent to the anode 104 and a second fluid distribution media layer 110 is adjacent to the cathode 106. A first separator plate surface or substrate (e.g bipolar plate) 112 is in contact with the first fluid distribution media layer 108, and a second separator plate surface 114 contacts the second fluid distribution media layer 110. According to the present invention, it is preferred that the fluid distribution media 107 and the first and second substrates 113,115 are constructed of electrically conductive materials and electrical contact is established therebetween at one or more electrical contact regions 116 where an electrically conductive path is formed between a substrate sheet (113 or 115) and the corresponding porous media (108 or 110).

Preferred materials of construction for the separator plate substrates 113,115 include conductive metals, such as stainless steel, aluminum, and titanium, for example. The most preferred materials of construction for the separator plate substrates 113,115 are higher grades of stainless steel/alloys that exhibit high resistance to corrosion in the fuel cell, such as, for example, 316L, 317L, 256 SMO, Alloy 276, and Alloy 904L.

According to the present invention, the porous fluid distribution media 107 comprises an electrically conductive non-metallic composition. First external surfaces 117 of the fluid distribution media 107 refers to those surfaces of the first and second fluid distribution media layers 108, 110 which contact the substrate sheets 113,115. Second external surfaces 118 of the fluid distribution media 108, 110 are exposed to the MEA 100.

The fluid distribution media 107 is preferably highly porous (i.e. about 60%-80%), having a plurality of pores 120 formed within a body 121 of the fluid distribution media 108, 110. The plurality of pores 120 comprise a plurality of internal pores 122 and external pores 124 that are open to one another and form continuous flow paths or channels 126 throughout the body 121 that extend from the first external surface 117 to the second external surface 118 of the fluid distribution media 107. Internal pores 122 are located within the bulk of the fluid distribution media and external pores 124 end at the diffusion element surface. As used herein, the terms "pore" and "pores" refers to pores of various sizes, including so-called "macropores" (pores greater than 50 nm diameter), "mesopores" (pores having diameter between 2 nm and 50 nm), and "micropores" (pores less than 2 nm diameter), unless otherwise indicated, and "pore size" refers to an average or median value including both the internal and external pore diameter sizes. It is preferred that the average pore size be equivalent to a radius of greater than about 2 μm and less than about 30 μm. Since these openings are disposed internally within the body 121 of fluid distribution media layers (e.g. 108, 110) the surfaces of the openings are referred to as internal surfaces 128, or the media interior.

According to the present invention, preferred non-metallic conductive fluid distribution media 107 comprises carbon. Such fluid distribution media is well known in the art, and preferably comprises carbon fiber or graphite. The porous fluid distribution media 107 may be manufactured as paper, woven cloth, non-woven cloth, fiber, or foam. One such known porous fluid distribution media 107 comprises a graphite paper having a porosity of about 70% by volume, an uncompressed thickness of about 0.17 mm, which is commercially available from the Toray Company under the trade name Toray TGPH-060. Reactant fluids are delivered to the MEA 100 via the fluid flow channels 126 within the first and second porous media layers 108, 110, where the electrochemical reactions occur and generate electrical current.

Electrical contact through an electrically conductive path at the contact regions 116 is dependent upon the relative electrical contact resistance at an interface of the surfaces of the contacting elements. Although non-metallic fluid distribution media 107 is preferred for its corrosion resistance, strength, physical durability in a fuel cell environment, and low bulk electrical resistance, it has been found that the interface between a metal substrate 113,115 and non-metal fluid distribution media 107 can contribute to an increased electrical contact resistance at the interface due to the dissimilarity of the respective materials. It is believed that the molecular interaction between the metal and non-metal material at such an interface may increase the contact resistance due to differences in the respective surface energies and other molecular and physical interactions. Thus, one aspect of the present invention provides a conductive material coated on the material comprising the outer surfaces of the pores 120 of the porous non-metallic fluid distribution media along surface 107 to form metallized regions 130. The metallized regions 130 are formed along the first external surfaces 117 that confront the metal substrates 113,115. The metallized regions 130 integrated with the fluid distribution media layer 107 at the first external surface 117 and have been demonstrated to sustainedly reduce contact resistance when compared with fluid distribution media layers having no metal coating or metallized regions. It is preferred that the contact resistance of the electrically conductive element of the present invention is less than 30 mOhm-cm$^2$ and more preferably less than 15 mOhm-cm$^2$. Although not limiting to the manner in which the present operation operates, it is believed that the conductive metallized regions 130 at the contact surface 117 of the fluid distribution media 107 provide an improved electrical interface at the contact regions 116 by contacting similar materials (i.e. metals) with correspondingly similar molecular and physical characteristics (e.g. surface energies). Further, it is believed that the metallized regions 130 on the porous fluid distribution media 107 provide more even electrical current distribution through the body 121 of the media 107 as the current approaches the discrete and non-continuous contact regions 116 associated with the lands 131 of the flow field configuration on the separator plate substrates 113,115.

In one preferred embodiment according to the present invention, the metallized regions 130 are applied along the external surface 117 of the fluid distribution media 107. The thickness of the metallized regions 130 is less than 80 nm, preferably less than 50 nm, and more preferably between about 2 to about 10 nm. In certain preferred embodiments according to the present invention, the thickness of the metallized regions 130 is less than or equal to the depth of two atomic monolayers of the metal selected for the coating 130. A most preferred thickness of the metallized regions 130 is a monatomic layer, or an average thickness equal to the diameter of about one atom of the coating material, or a depth of about one layer of atoms of the coating material. Such as thickness corresponds to a thickness of less than about 1 nm. In particular embodiments the thickness is from about 0.3 nm to about 0.5 nm.

"Ultra-thin" layers of conductive metal deposited within the metallized regions generally refers to thicknesses less than about 40 nm, more preferably less than 15 nm, and most preferably less than or equal to the depth of two atomic monolayers. In one particular embodiment of the invention, the "ultra-thin" layers of conductive metal deposited within the metallized regions refers to layer having an average thickness equal to the diameter of about one atom of conductive metal.

It is preferred that the conductive metallized regions 130 also coat the external pore 124 surfaces and the surfaces 128 of the internal pores 122 and extends into the body 121 of the fluid distribution media 107 at a depth of at least about 2 to about 10 nm. It is preferred that the metallized regions 130 are electrically conductive, oxidation resistant, and acid-resistant and in certain preferred embodiments the electrically conductive material forming the metallized region comprises a noble metal selected from the group consisting of: ruthenium (Ru), rhodium (Rh), palladium (Pd), silver (Ag), iridium (Ir), platinum (Pt), osmium (Os), and compounds and/or alloys thereof, Other preferred materials for the metallized regions 130 include those that comprise chromium (Cr) or compounds of Cr, such as chromium nitride (CrN). A most preferred metal for the metallized regions 130 comprises gold (Au). As recognized by one of skill in the art, the conductive metal composition may comprise mixtures of the above identified metals and/or metal nitrides. It should further be recognized that the metallized regions 130 can comprise conductive metal oxides, for instance, as non-limiting examples, ruthenium oxide ($RuO_2$), iridium oxide ($IrO_2$), fluorine doped tin oxide ($SnO_2$:F) and mixtures thereof.

Figure 5:
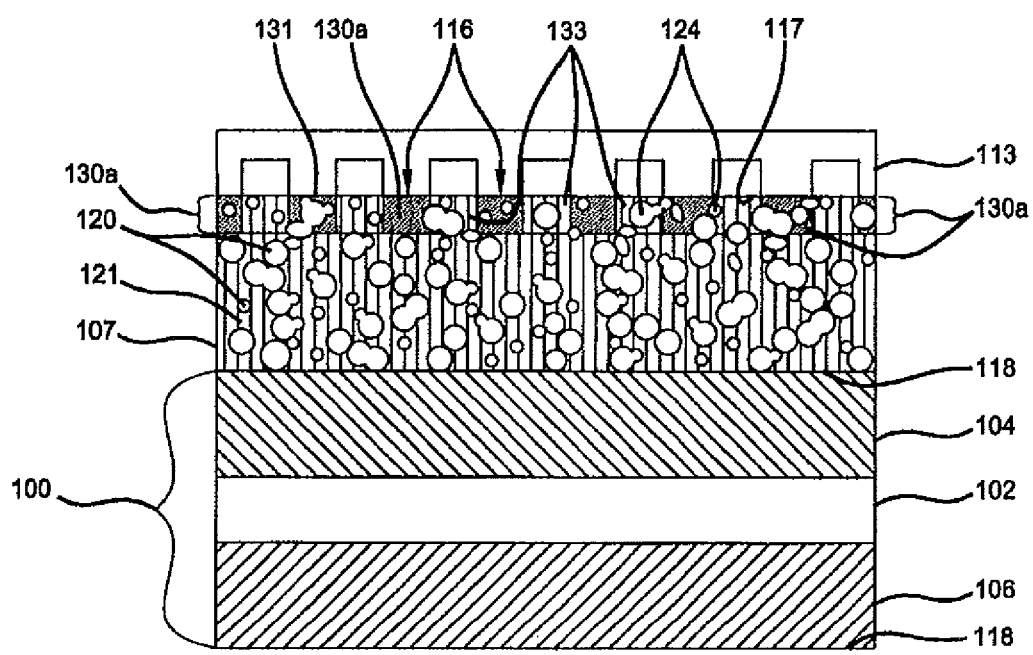
FIG. 5 is a not-to-scale partial side-sectional detailed view of a single layer of porous media adjacent to a membrane electrode assembly according to alternate preferred embodiments of the present invention where the metallized regions are discrete.

In one alternate preferred embodiment of the present invention, shown in FIG. 5, discrete metallized regions 130a of the porous media 107 correspond to electrically conductive regions of the external surface 117, and the non-metallized regions 133 correspond to the electrically non-conductive regions. Electrically conductive regions include those areas that contact lands 131 and establish the electrically conductive path at the contact regions 116. In other preferred embodiments, such as that shown in FIG. 4, the metallized regions 130 cover the entire surface of the external surface 117 which promotes more even current distribution into the body 121 of the porous media 107. In the embodiment with discrete metallized regions 130a corresponding to electrically active contact regions 116, the electrically non-conductive and non-metallized regions of external surfaces 117 are covered or masked while the conductive metal is applied. A mask is any material that is applied to a substrate and remains stable during coating application. Often, mask materials are selected to permit recovery and recycling of the metals deposited over the mask during the deposition process, and are well known in the art. Preferred mask materials compatible with the present invention include, by way of example, metals, such as stainless steel and titanium, or silicon and alumina based ceramics.

A variety of depositing methods may be employed to apply the conductive metal compositions that form the metallized regions 130 of the fluid distribution media 107. One preferred method of depositing the conductive metal of the metallized regions 130 onto the fluid distribution porous media 107 will now be described with reference to FIG. 6. In order to deposit the conductive metal onto the substrate, an ion-assisted, physical vapor deposition (PVD) method is employed.

Figure 6:
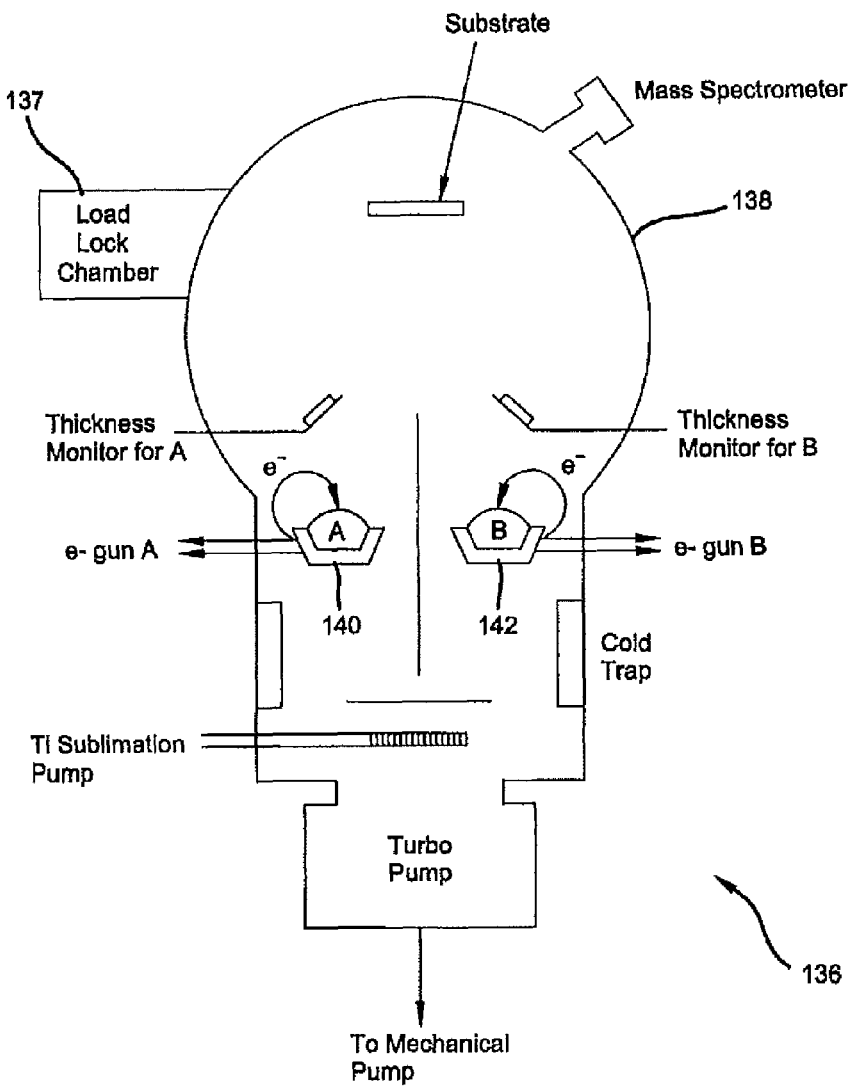
FIG. 6 is a an illustration of a physical vapor deposition apparatus used to metallize a surface of a porous fluid distribution media with an electrically conductive metal.

In FIG. 6, an ion-assisted PVD apparatus 136 that is used to apply the conductive metal composition of the metallized regions 130 is shown. The apparatus 136 includes a deposition chamber 138 and two electron guns, A and B, for deposition of the metal coating. The apparatus 136 also includes a turbo pump which allows the apparatus to operated in an ultra-high vacuum. The substrate to be coated with the conductive metal is first placed in a "load-lock" chamber 137 where the pressure is between about $10^{-5}$ to $10^{-6}$ Torr or $1.3\times10^{-3}$ Pa to $1.3\times10^{-4}$ Pa. The substrate is then transferred to the deposition chamber 138. Once the substrate is placed into the chamber 138, the pressure is lowered to about $10^{-9}$ Torr ($1.3\times10^{-7}$ Pa). A first crucible 140 in the chamber holds the metal to be deposited. If a combination of metals or noble metals is to be deposited, a second metal is held by a second crucible 142. For example, the first crucible 140 contains a first metal (e.g. titanium) that is deposited as a first layer and crucible 142 contains a second metal (e.g. gold) which is deposited over the first layer, forming a second layer. Another option available may be to deposit a combination of metals simultaneously. Noble metals are deposited on the substrate at a rate of 0.10 nm/s to a thickness of less than 80 nm, which is observed by thickness monitors known in the art. The metallized regions 130 may have conductive metal deposited onto the substrate at ultra-low thicknesses of less than 80 nm, preferably less 40 nm, more preferably about 2 to about 10 nm, and most preferably about 0.3 nm to about 0.5 nm. When the metallized region 130 has a thickness of at least about 2 nm, it is preferably that the loading is 0.02 mg/cm². It is possible with the present process to coat only a very thin layer (i.e. an ultra-thin layer on the order of 10-20 nm), and preferably a monoatomic layer on the order of about 0.3 to about 0.5 nm, thereby achieving good surface coverage, relatively uniform coverage, and good adhesion. Such ultra-thin layers are cost-effective and have now been found to be effective even when monoatomic. Thus, the use of ion-assisted, PVD allows the electrically conductive material to be deposited on the substrate very smoothly, evenly, and in a lower-cost ultra-thin layer.

Another preferred method of applying a metal coating 130 according to the present invention include electron beam evaporation, where the substrate is contained in a vacuum chamber (from between about $10^{-3}$ to $10^{-4}$ Torr or about $1.3\times10^{-1}$ Pa to $1.3\times10^{-2}$ Pa) and a metal evaporant is heated by a charged electron beam, where it evaporates and then condenses on the target substrate. One particular way to deposit a monoatomic layer is to impose an ultrahigh vacuum (UHV) on the chamber so as to prevent interactions with other atoms. Such interatomic interactions cause a non-uniform deposition of the monoatomic layer. As an illustrative example, an ultrahigh vacuum may include a pressure of less than about $1\times10^{-8}$ Torr (less than $1\times10^{-6}$ Pa).

In a further embodiment of the invention, a preferred method of applying metallized regions 130 of the fluid distribution media 107 includes atomic layer deposition (ALD), also known as atomic layer epitaxy (ALE). ALD is a self-limiting method for chemically depositing or growing ultra-thin films on a substrate. The method involves subjecting the substrate to self-saturating surface reactions. The surface reactions may be conducted sequentially and/or in an alternating fashion, depending on the composition and structure of the film desired. The ALD process is described in U.S. Pat. No. 4,058,430 of Suntola et al., incorporated herein by reference.

An ALD apparatus may be characterized by a vacuum deposition chamber having a holder for a substrate, at least one vapor source (known as the precursor) and controlled means by which the substrate may be individually subjected to a vapor source. The controlled means may include heaters, coolers and high speed valves for controlling the exposure of the substrate to the vapor source.

The ALD process for deposition of metallized regions 130 involves reaction of the surface of the fluid distribution media 107 in a deposition chamber with a single vapor of an electrically conductive material or reaction of the surface with multiple vapors introduced one at a time and consisting of the elementary components of the electrically conductive material. The vapor may be pulsed into the vacuum deposition chamber on a carrier gas and may be quickly purged, for example, by vacuum pumping or flushing with an inert gas. Such pulsing of the vapor and purging of the system may be performed to control the dose of the precursor vapor to which the substrate is exposed.

Generally, the ALD process is performed at elevated temperatures and reduced pressures. It is important that the temperature of the deposition chamber be high enough that reaction between the substrate and the precursor vapor occurs, while also preventing condensation of the vapor onto the surface. As nonlimiting examples, the reaction space in the deposition chamber may be heated to between about 150° C. and about 600° C., and the operating pressure may be between about $7.5 \times 10^{-2}$ Torr and about 4 Torr (about 1 Pa to about 5000 Pa).

As a result of ALD surface reactions, not more than one atomic layer of the electrically conductive material is bound to the surface, thereby providing a monoatomic coating of electrically conductive material. With sequential or alternating reactions, composite layers may be formed. Furthermore, additional atomic monolayers may be grown, thereby providing a coating with a higher thickness. It should be understood that the electrically conductive material deposited by ALD may include metal alloys and laminates, e.g. additional monoatomic layers.

As an illustrative example, a monoatomic layer coating comprising Au may be deposited by ALD. Such a monoatomic layer may be deposited onto a distribution media surface by first pulsing a gold precursor vapor, selected from the family of organic and inorganic gold precursors or combinations thereof. As a nonlimiting example, the gold precursor may include dimethyl acetylacetonate Au. The precursor may be pulsed into a deposition chamber on an inert carrier gas such as, for example, argon or nitrogen. The chamber may subsequently be purged with a reactive gas, for example oxygen, resulting in a monoatomic layer coating of Au on the surface of the distribution media.

Monoatomic layer coatings can be also be deposited by electrochemical reactions. One particular example of an electrochemical form of deposition includes under-potential deposition (UPD). In general, UPD is a phenomenon where an element is deposited at a potential prior to (or under) that needed to deposit the element onto itself. This effect can result from, in certain instances, increased stability caused by reaction of the element with a first element present at the substrate surface. As a nonlimiting example of UPD, a second element may be reacted at a controlled potential with a previously deposited atomic layer of a first element to form a single atomic layer of the desired chemical species. The use of UPD provides increased control over the deposited structure, morphology, and composition, and thus is useful in deposition of single atomic layers.

A further electrochemical method by which monoatomic layers may be deposited, and which may also be used in conjunction with UPD, is known in the art as displacement deposition. Electrochemical displacement deposition reactions involve electrochemical precipitation of a second metal, from a solution including the salt of the second metal, onto a substrate having a first and more reactive or electropositive metal. The first metal, in turn, progressively dissolves and is displaced with the second metal. Thus, a monoatomic coating layer of one element deposited by any number of the aforementioned methods may be subsequently displaced with another element by displacement deposition.

As an illustrative example of a displacement deposition process, a more reactive metal such as copper may be deposited as a monatomic layer by ALD. The monolayer of copper may then be replaced by displacement deposition with a noble metal, for example, gold. The displacement deposition provides for contact of the copper surface with a dissolved salt of gold, for example, gold chloride. This contact allows the more reactive copper metal on the coated surface to dissolve in the solution and be displaced with a monoatomic layer of gold.

An additional PVD method that may be suitable for the present invention is magnetron sputtering, where a metal target (the conductive metal for the metallized regions 130) is bombarded with a sputter gun in an argon ion atmosphere, while the substrate is charged. The sputter gun forms a plasma of metal particles and argon ions that transfer by momentum to coat the substrate. However, the use of ion-assisted PVD as previously described may provide better control of plasma than in magnetron sputtering because in sputtering the direction of the plasma may be harder to regulate. Ion-assisted PVD provides better control of the deposition parameters because the ion beams have low energy and are well collimated, with divergence angles of only a few degrees. Due to the higher difficulty in regulation when compared to PVD or ALD methods, however, magnetron sputtering may not be suitable for smooth and even deposition of monoatomic coatings. It is recognized that various factors may promote the use of one application method over another, including overall processing time and cost.

The conductive metal of the metallized regions 130 may also be applied by electroplating (e.g. electrolytic deposition), electroless plating, or pulse laser deposition. A higher difficulty in regulation and control with these methods, however, means that they may also not be suitable for uniform deposition of monoatomic coatings, especially in comparison to the aforementioned methods of physical vapor deposition, electron beam evaporation, atomic layer deposition, under-potential deposition, and displacement deposition.

Preferred embodiments of the present invention provide a low contact resistance across the separator plate substrates 113,115 through the porous media 107 having the metallized regions 130. Further, electrically conductive elements according to the present invention do not require the removal of a passivation layer (i.e. metal oxide layer) from the metallic separator plate substrates 113,115 along contact surfaces 132 prior to their incorporation into the conductive element of the present invention. Generally, a metal substrate 113,115 having an oxide layer that contacts a non-metallic fluid distribution layer (without metallized regions 130) creates an impermissibly high electrical contact resistance. Thus, prior art methods of removing the oxide layer include a variety of methods, such as cathodic electrolytic cleaning, mechanical abrasion, cleaning the substrate with alkaline cleaners, and etching with acidic solvents or pickle liquors. The present invention eliminates the necessity of removing the metal oxides from the contact surfaces 132 of the metallic separator plate 113,115.

Thus, one preferred aspect of the present invention includes employing the separator element substrate 113,115 comprising stainless steel, where the substrate surface 113, 115 does not require the extensive removal of a passivation layer from the contact surface 132. The improved electrical conductivity at the interface at the contact regions 116 provided by the metallized region coating 130 on the porous media 107 permits use of metals in the separator element substrates 113,115 that have a naturally occurring oxide layer at the contact surface 132. Hence, the present invention eliminates the costly and time intensive pre-processing step of removing metal oxides from the contact surface 132 of the metal substrates 113,115. Further, higher grades of stainless steel previously discussed have a high corrosion resistance, and thus can be used without any further protective treatment due to their ability to withstand the corrosive environment within the fuel cell.

The present invention is also suitable for use with separator plate element substrates 113,115 that are coated with electrically conductive protective coatings that provide corrosion resistance to the underlying metal substrate 113,115. Such coatings may comprise oxidation and corrosion resistant noble metal coating 130 layers (e.g. Au, Ag, Pt, Pd, Ru, Rh, Ir, Os, and mixtures thereof) or corrosion resistant electrically conductive polymeric matrices, which generally comprise oxidation resistant polymers dispersed in a matrix of electrically conductive corrosion resistant particles, as are known in the art. The protective coatings preferably have a resistivity less than about 50 µ ohm-cm (Ω-cm) and comprise a plurality of oxidation-resistant, acid-insoluble, conductive particles (i.e. less than about 50 microns) dispersed throughout an acid-resistant, oxidation-resistant polymer matrix, where the polymer binds the particles together and holds them on the surface 132 of the metal substrate 113,115. The coating contains sufficient conductive filler particles to produce a resistivity no greater than about 50 µohm-cm, and has a thickness between about 5 microns and about 75 microns depending on the composition, resistivity and integrity of the coating. Cross-linked polymers are preferred for producing impermeable coatings which protect the underlying metal substrate surface from permeation of corrosive agents.

Preferably, the conductive filler particles are selected from the group consisting of gold, platinum, graphite, carbon, nickel, conductive metal borides, nitrides and carbides (e.g. titanium nitride, titanium carbide, titanium diboride), titanium alloyed with chromium and/or nickel, palladium, niobium, rhodium, rare earth metals, and other nobel metals. Most preferably, the particles will comprise carbon or graphite (i.e. hexagonally crystallized carbon). The particles comprise varying weight percentages of the coating depending on the density and conductivity of the particles (i.e., particles having a high conductivity and low density can be used in lower weight percentages). Carbon/graphite containing coatings will typically contain 25 percent by weight carbon/graphite particles. The polymer matrix comprises any water-insoluble polymer that can be formed into a thin adherent film and that can withstand the hostile oxidative and acidic environment of the fuel cell. Hence, such polymers, as epoxies, polyamide-imides, polyether-imides, polyphenols, fluroelastomers (e.g., polyvinylidene flouride), polyesters, phenoxy-phenolics, epoxide-phenolics, acrylics, and urethanes, inter alia are seen to be useful with the present invention. In such an embodiment, where the surfaces 132 are overlaid with a protective coating, the metal substrates 113,115 comprise a corrosion-susceptible metal such as aluminum, titanium, or lower grade stainless steel that is coated with a corrosion resistant protective coating.

In certain embodiments of the present invention, it is preferred that the contact surface 132 of the separator element metal substrates 113,115 has essentially clean surface, where loosely adhered contaminants are removed, prior to incorporation into the electrically conductive element. Such cleaning typically serves to remove any loosely adhered contaminants, such as oils, grease, waxy solids, particles (including metallic particles, carbon particles, dust, and dirt), silica, scale, and mixtures thereof. Many contaminants are added during the manufacturing of the metal material, and may also accumulate on the contact surface 132 during transport or storage. Thus, cleaning of the contact surface 132 of the metal substrate 113,115 is especially preferred in circumstances where the metal substrate 113,115 is soiled with contaminants. Cleaning of the metal substrate 113,115 may entail mechanical abrasion; cleaning with traditional alkaline cleaners, surfactants, mild acid washes; or ultrasonic cleaning. The choice of the appropriate cleaning process or sequence of cleaning processes is selected based upon both the nature of the contaminant and the metal.

Experimental details regarding an illustrative embodiment of the present invention will now be described in detail. In this illustrative embodiment, gold is chosen as the noble electrically conductive material to be deposited by ion-assisted PVD onto Toray fluid distribution media graphite paper having a porosity of about 70% by volume, an uncompressed thickness of about 0.17 mm, which is commercially available from the Toray Company, as the product Toray TGPH-060. In the first experiment, gold was deposited by PVD onto the Toray paper by a Teer magnetron sputter system. The magnetron targets were 99.99% pure Au. The Au deposition was done at 50V bias using 0.2 A for one minute to achieve a gold coating 130 thickness of 10 nm.

Figure 7:
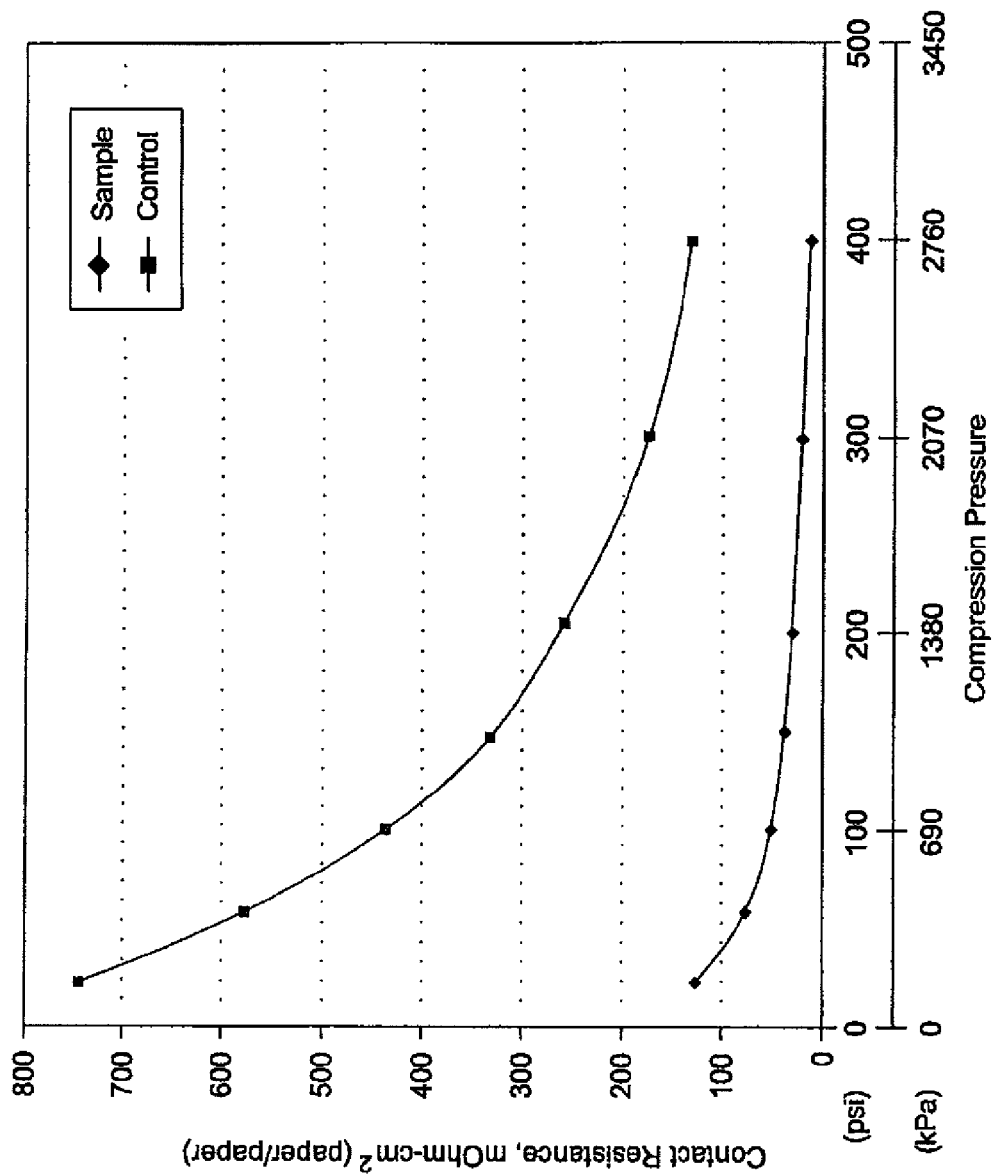
FIG. 7 is a graph comparing a measurement of contact resistance achieved through a 316L stainless steel plate contacting a porous fluid distribution media having metallized regions along a contact surface according to the present invention with a prior art porous fluid distribution media.

As shown in FIG. 7, the Sample was prepared in the experiment described above and the Control is a non-coated prior art Toray 060 graphite paper having the same specifications as the Sample prior to the coating process. The contact resistance was measured across both the Sample and Control through a 316L stainless steel flat plate through a range of pressures. A surface area of 49 cm$^2$ was tested using 50 A/cm$^2$ current which is applied by a direct current supply. The resistance was measured using a four-point method and calculated from measured voltage drops and from known applied currents and sample dimensions. The voltage drop was measured "paper-to-paper" for both the Sample and Control, meaning an assembly was formed by sandwiching the steel plate between two diffusion media layers, where the voltage was measured across the assembly. Contact resistance measurements were measured as milli-Ohm per square centimeter (mΩ/cm$^2$) with incremental force applied. The 316L stainless steel plates were not treated (i.e. no removal of oxide layers or cleaning), but rather used in the condition as received from the manufacturer. The paper without the gold coating 130 exhibits high contact resistance values, with the lowest contact resistance value at approximately 125 mOhm-cm$^2$ when the pressure applied is 400 p.s.i. (2700 kPa). The Sample prepared in accordance with the present invention demonstrates significantly lower contact resistance (i.e. less than approximately 125 mOhm-cm$^2$) through the interface at the contact regions over across the entire contact surface and over the range of compression pressures tested.

Figure 8:
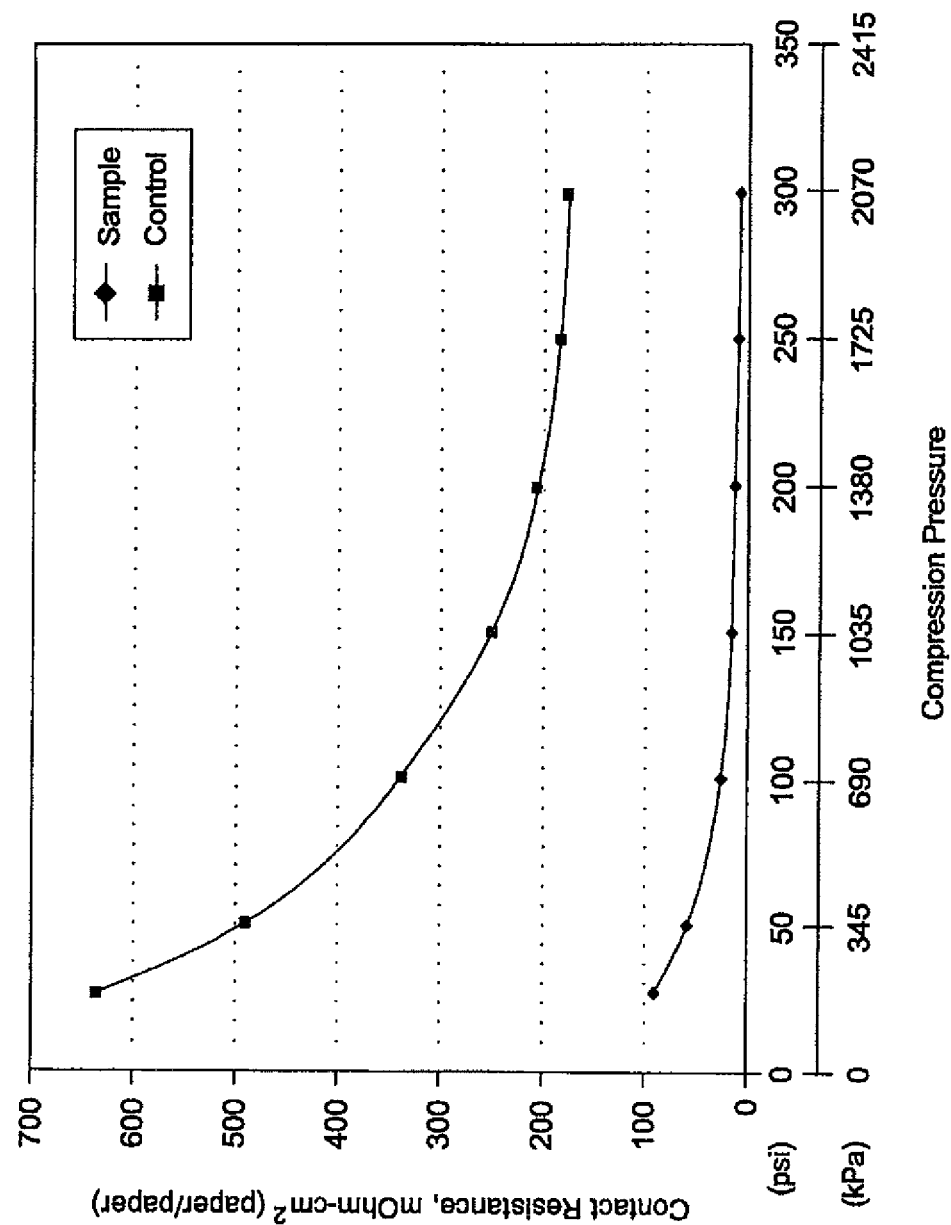
FIG. 8 is a graph of contact resistance values achieved by an electrically conductive element of the present invention having a separator element with a flow field formed therein and a layer of porous media having a surface with metallized regions, as compared with a prior art conductive element assembly.

In FIG. 8, another comparison was performed between the same Sample and Control as in FIG. 7, however, the 316L stainless steel used in the contact resistance measurement was machined with grooves along the contact surface to form flow channels and lands (in a 1:1 ratio of lands to grooves), with a compression pressure measured for the entire surface area. Thus the electrical contact regions were thus formed at the discrete land regions. The 316L stainless steel was otherwise untreated. As demonstrated across the range of applied pressures, the Sample prepared according to the present invention was significantly lower in contact resistance than the prior art Control, and showed an even greater improvement discrepancy between the sample and control contact resistance values (i.e. greater than 150 mOhm-cm$^2$ at the highest pressure tested of 300 p.s.i. or 2000 kPa) than that shown in FIG. 7 above. Thus, conductive elements prepared in accordance with the present invention have an improved electrical interface between the non-metallic porous fluid distribution media and the metallic substrate of the separator element. The metallized regions of the present invention provide an ultra-thin conductive metal coating that sufficiently covers the surface of the porous fluid distribution element to provide a low contact resistance for an electrically conductive fluid distribution element, which improves the overall performance of a fuel cell. Furthermore, the thickness of the metal coating is such that the manufacturing cost of preparing an electrically conductive fluid distribution element is minimized. Processing costs are further reduced by eliminating the step of removing metal oxides from metal substrates that will form an electrical interface with the fluid distribution element. The improved electrical interface reduces contact resistance and promotes more widespread and even current distribution, which will increase the operational efficiency and overall lifetime of the membrane and the fuel cell stack.

The Sample described above may also be produced by alternate methods including, for example, ion-assisted PVD and atomic layer deposition. A Sample produced by such methods may have a monoatomic layer coating comprising gold. For example, in the ion-assisted PVD embodiment, gold is chosen as the noble electrically conductive metal to be deposited by ion-assisted PVD onto Toray fluid distribution media graphite paper having a porosity of about 70% by volume, an uncompressed thickness of about 0.17 mm. The graphite paper is commercially available from the Toray Company, as the product Toray TGPH-060. In this experiment, gold is deposited by PVD onto the Toray paper. The magnetron targets are 99.99% pure Au. A single electron beam evaporation is used to deposit the gold coating 130 to a monoatomic thickness of approximately 03 nm to 0.5 nm, at a rate of approximately 0.04 nm/s. The temperature during deposition does not exceed a temperature between about 35° C. and 40° C. and the deposition is completed in a time of less than 10 seconds.

In an illustrative atomic layer deposition (ALD) example, the gold coating 130 on the Sample described above is applied onto Toray fluid distribution media graphite paper by an ALD system. Samples of the Toray fluid distribution media graphite paper are placed into an ALD deposition chamber. The reaction space in the deposition chamber is heated to a temperature greater than 150° C. at an operating pressure between about $7.5 \times 10^{-2}$ Torr and about 4 Torr. A gold precursor comprising dimethyl acetylacetonate Au is pulsed into the deposition chamber on an argon carrier gas at a flow rate of about 50 ml/min to about 200 ml/min, followed by a purge of oxygen gas to complete the ALD reaction. A single monoatomic layer coating on graphite paper, having a thickness of approximately 0.3 nm to 0.5 nm, is thereby provided.

It has been further demonstrated that ultra-thin coatings at the diffusion media/bipolar plate interface exhibit an equally low resistance in comparison to thicker coatings and have a negligible interface resistance in comparison to other parts of the fuel cell assembly. See, for example, U.S. Published Application No. 2005/0100771, herein incorporated by reference in its entirety. Thus, one of skill in the art should appreciate that a Sample having a monoatomic gold layer exhibits a contact resistance substantially similar to that of the Sample depicted in FIGS. 7 and 8.

The description of the above embodiments and method is merely exemplary in nature and, thus, variations that do not depart from the gist of the invention are intended to be within the scope of the invention. Such variations are not to be regarded as a departure from the spirit and scope of the invention.

What is claimed is:

1. An electrically conductive element for use in a fuel cell comprising:
    a conductive metal substrate having a major surface with surface oxides formed thereon;
    a layer of conductive non-metallic porous media having a surface facing said major surface of said metal substrate, wherein said layer defines pores forming flow paths therethrough, wherein each of said pores is a discrete interstice formed within said layer, said pores including internal pores and external pores; and
    one or more metallized regions on said surface of said layer, each said metallized region containing an electrically conductive material and having an average thickness less than or equal to a depth of two atomic monolayers, wherein said electrically conductive material is deposited on interior surfaces of at least a portion of said internal pores and at least a portion of said external pores in said one or more metallized regions, said electrically conductive material extending into a body of said layer at a depth of about 2 nm to about 10 nm, and wherein said major surface of said conductive metal substrate is arranged in contact with said one or more metallized regions to provide an electrically conductive path from said layer through said one or more metallized regions and said surface oxides to said metal substrate.

2. The electrically conductive element according to claim 1, wherein each of said metallized regions provides an increased electrical conductivity as compared to a non-metallized region.

3. The electrically conductive element according to claim 1, wherein said one metallized region essentially entirely covers said surface of said layer.

4. The electrically conductive element according to claim 1, wherein said conductive metal substrate has a surface facing said layer which is patterned with a plurality of grooves and lands, and wherein said lands are in contact with respective said metallized regions.

5. The electrically conductive element according to claim 4, wherein substantially an entire surface of each said land is in contact with a respective said metallized region.

6. The electrically conductive element according to claim 1, wherein said layer of conductive non-metallic porous media includes one or more non-metallized regions on said surface of said layer, wherein said conductive metal substrate is in contact with said metallized regions and said non-metallized regions.

7. The electrically conductive element according to claim 1, wherein said electrically conductive material of said metallized regions is selected from the group consisting of: Cr, CrN, Ru, Rh, Pd, Ag, Ir, Pt, Os, Au, and mixtures thereof.

8. The electrically conductive element according to claim 1, wherein said average thickness of said electrically conductive material is equal to a diameter of about one atom.

9. An assembly for use in a fuel cell comprising:
    an electrically conductive metal substrate having a major surface with surface oxides formed thereon;
    a layer of electrically conductive porous fluid distribution media having a first surface and a second surface, said first surface facing said major surface of said metal substrate, wherein said layer defines pores forming flow paths therethrough, wherein each of said pores is a discrete interstice formed within said layer, said pores including internal pores and external pores;
    a membrane electrode assembly, said second surface of said layer confronting the membrane electrode assembly; and one or more metallized regions on said first surface and said second surface of said layer, each said metallized region containing an electrically conductive material and having an average thickness less than or equal to a depth of two atomic monolayers, wherein said electrically conductive material is deposited on interior surfaces of at least a portion of said internal pores and at least a portion of said external pores in said metallized regions, said electrically conductive material extending into a body of said layer at a depth of about 2 nm to about 10 nm, wherein said major surface of said conductive metal substrate is arranged in contact with said metallized regions to provide an electrically conductive path from said layer through said metallized regions and said surface oxides to said metal substrate, and wherein an electrical contact resistance across said metal substrate through said metallized regions to said layer is less than a comparative contact resistance across a similar metal substrate and a similar layer of fluid distribution media absent said metallized regions.

10. A method for manufacturing an electrically conductive element for a fuel cell, comprising:

depositing an electrically conductive material on a surface of a layer of electrically conductive porous media to form one or more metallized regions and having an average thickness less or equal to a depth of two atomic monolayers, wherein said layer defines pores forming flow paths therethrough, wherein each of said pores is a discrete interstice formed within said layer, said pores including internal pores and external pores, wherein said electrically conductive material is deposited on interior surfaces of at least a portion of said internal pores and at least a portion of said external pores in said one or more metallized regions, said electrically conductive material extending into a body of said layer at a depth of about 2 nm to about 10 nm;

positioning said surface having said metallized regions adjacent to a major surface of a metallic electrically conductive substrate, said major surface having surface oxides formed thereon, said surface facing said major surface; and contacting said substrate with said surface having said one or more metallized regions to form an electrically conductive path from said layer through said one or more metallized regions and said surface oxides to said metal substrate.

11. The method according to claim 10, wherein said depositing is conducted by a process selected from the group consisting of: electron beam evaporation, magnetron sputtering, physical vapor deposition, electrolytic deposition, electroless deposition, atomic layer deposition, underpotential deposition, displacement deposition, and combinations thereof.

12. The method according to claim 10, wherein said contacting is accomplished by a compressive force imparted on said fuel cell in an assembled fuel cell stack.

13. The method according to claim 10, wherein said depositing is conducted by electron beam evaporation, and said electron beam evaporation is conducted under an ultra-high vacuum.

14. The method according to claim 10, wherein said depositing is conducted by atomic layer deposition, and said atomic layer deposition comprises subjecting said substrate to at least one precursor vapor of said electrically conductive material at a temperature sufficiently high for said vapor to react with said surface of said substrate but too high for said vapors to condense on said surface, and said atomic layer deposition is conducted at a temperature between about 150° C. and about 600° C. and at a pressure between about $7.5 \times 10^{-2}$ Torr and about 4 Torr.

15. The method according to claim 10 wherein said depositing comprises displacement deposition in which a second metal displaces a first metal on said surface of said electrically conductive porous media, and said displacement deposition comprises immersing said porous media having a layer of said first metal in a solution having a salt of second metal, and said first metal dissolves and said second metal is deposited onto said porous media and said first metal is more reactive than said second metal.

16. The method according to claim 15 wherein said first metal is selected from the group consisting of copper, zinc, iron and alloys thereof.

17. The method according to claim 15 wherein said second metal is selected from the group consisting of gold, platinum, iridium, rhodium and alloys thereof.

18. The method according to claim 10 wherein said depositing comprises underpotential deposition.

* * * * *